(12) United States Patent
Aruga

(10) Patent No.: US 6,300,998 B1
(45) Date of Patent: Oct. 9, 2001

(54) PROBE FOR INSPECTING LIQUID CRYSTAL DISPLAY PANEL, AND APPARATUS AND METHOD FOR INSPECTING LIQUID CRYSTAL DISPLAY PANEL

(75) Inventor: Yasuhito Aruga, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/372,929

(22) Filed: Aug. 12, 1999

(30) Foreign Application Priority Data

Aug. 12, 1998 (JP) .................................................. 10-228442

(51) Int. Cl.⁷ ....................................................... G02F 1/13
(52) U.S. Cl. ............................................................. 349/192
(58) Field of Search .............................................. 349/192

(56) References Cited

U.S. PATENT DOCUMENTS 5,608,558 * 3/1997 Katsumi ................................ 349/192

* cited by examiner

Primary Examiner—James A. Dudek
(74) Attorney, Agent, or Firm—Harness, Dickey & Pierce, P.L.C.

(57) ABSTRACT

To construct an unbreakable probe for inspecting a liquid crystal display panel, and to substantially reduce a manufacturing cost thereof, a plurality of terminals subjected to patterning on a probe unit 280 having flexibility are contacted to a plurality of terminals of scanning lines formed on a substrate 200. A plurality of terminals subjected to patterning on a probe unit 380 having flexibility are contacted to a plurality of terminals of data lines formed on a substrate 300 each other. A driving signal for driving the scanning lines is supplied to respective scanning lines via the terminals subjected to patterning on the probe unit 280, while a driving signal for driving the data lines is supplied to respective data lines via the terminals subjected to patterning on the probe unit 380.

16 Claims, 4 Drawing Sheets

[Fig. 1]
(a)
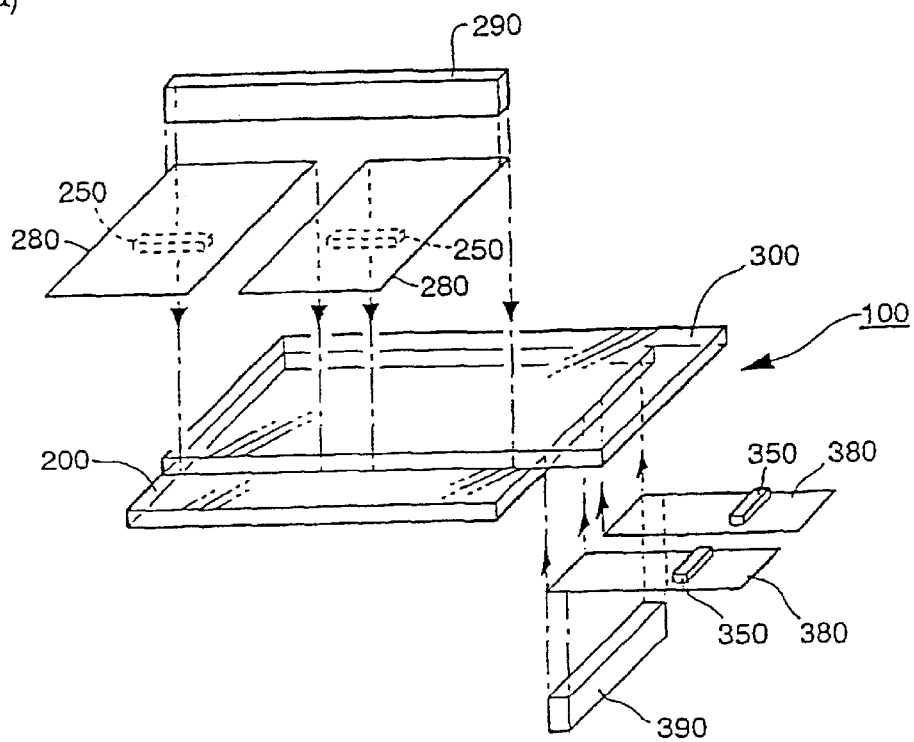
(b)
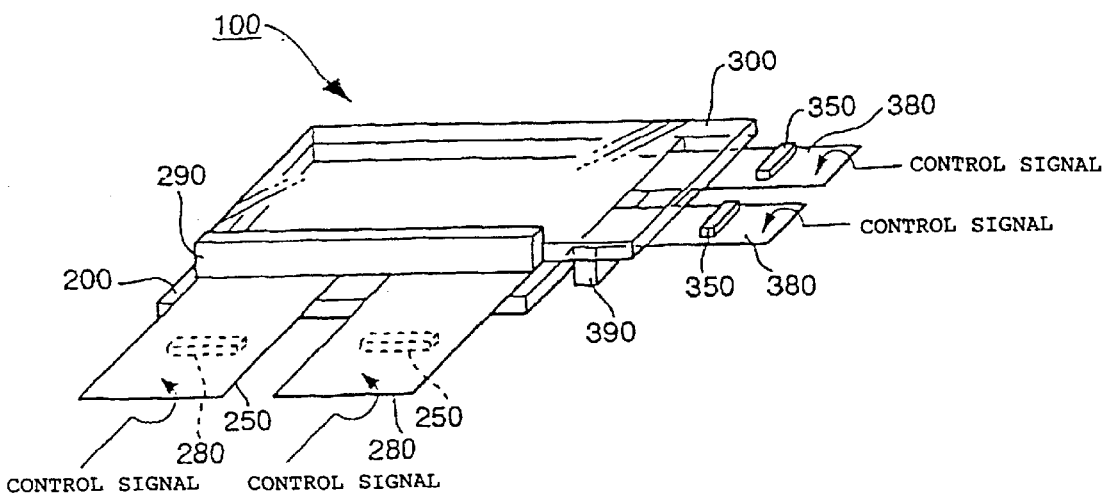

[Fig. 2]
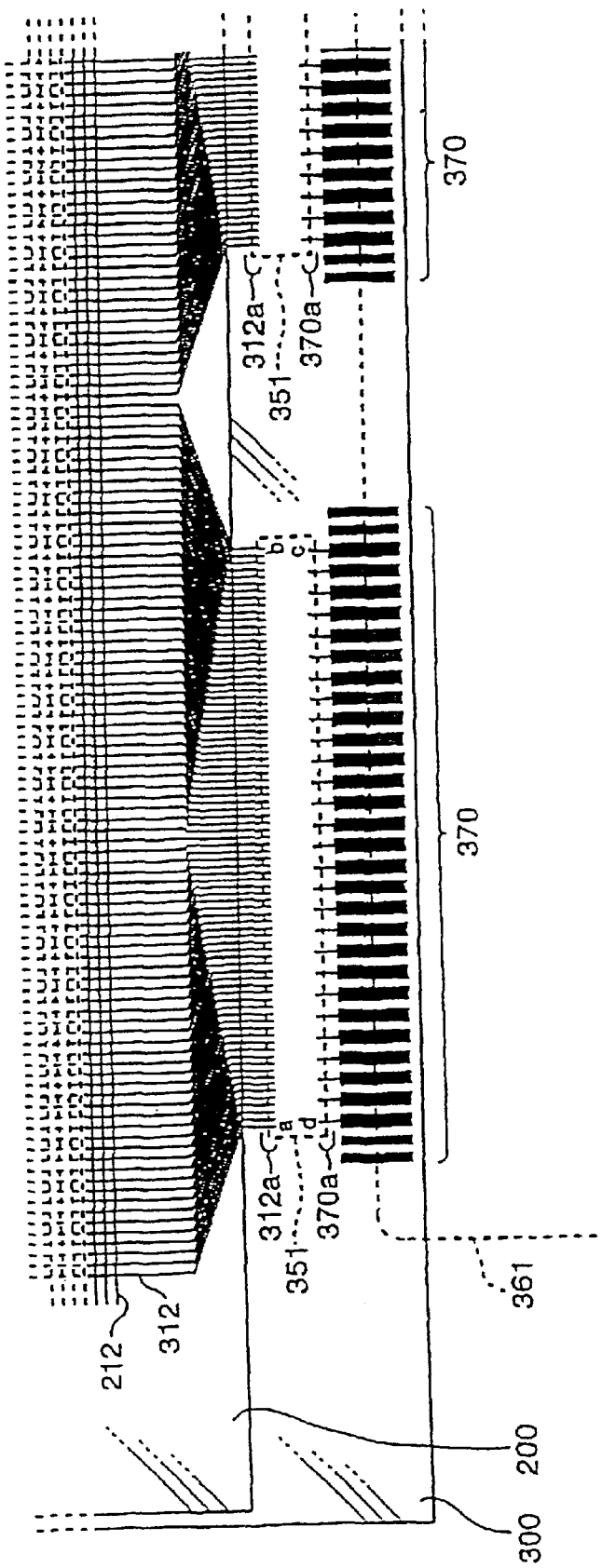

[Fig. 3]
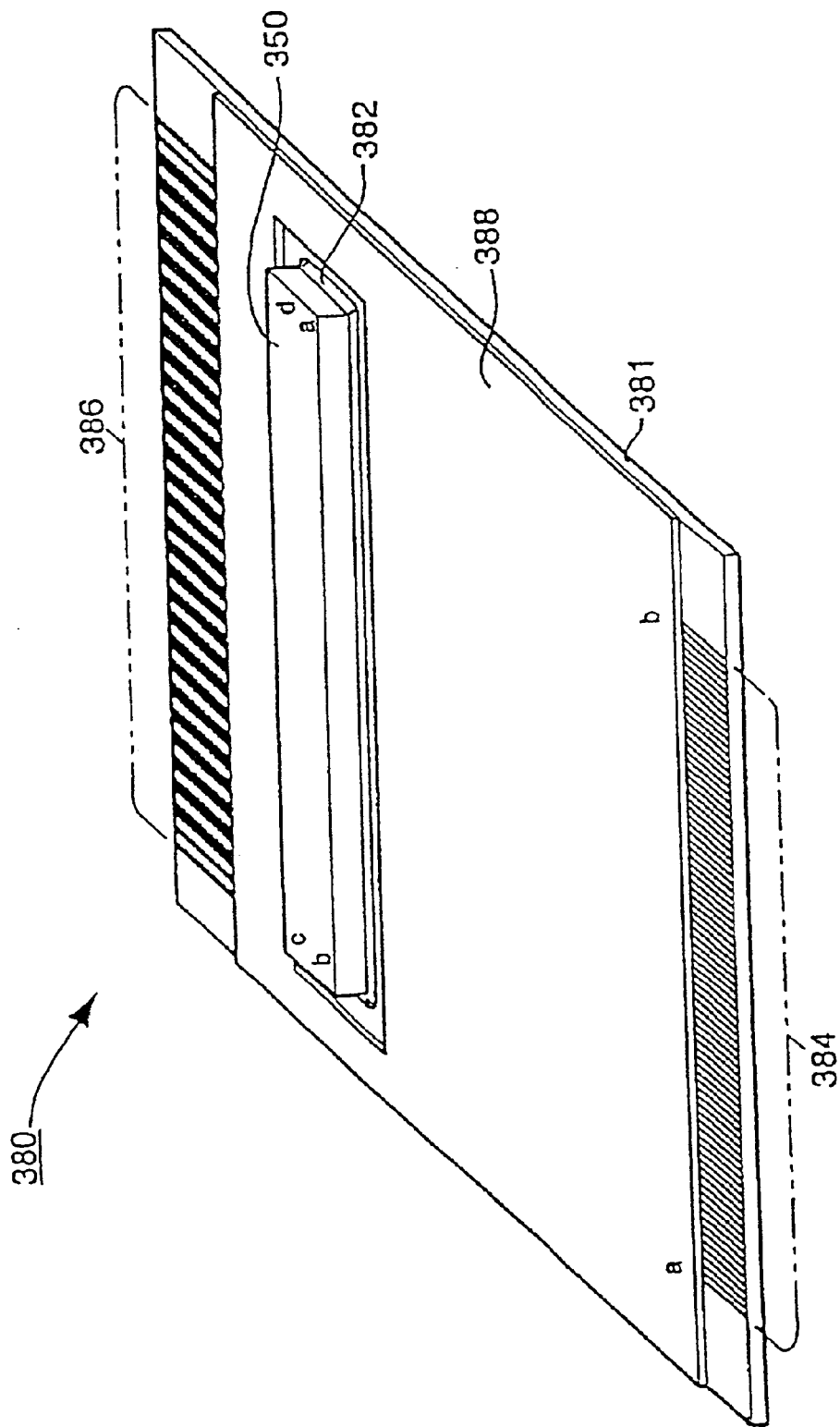

[Fig. 4]
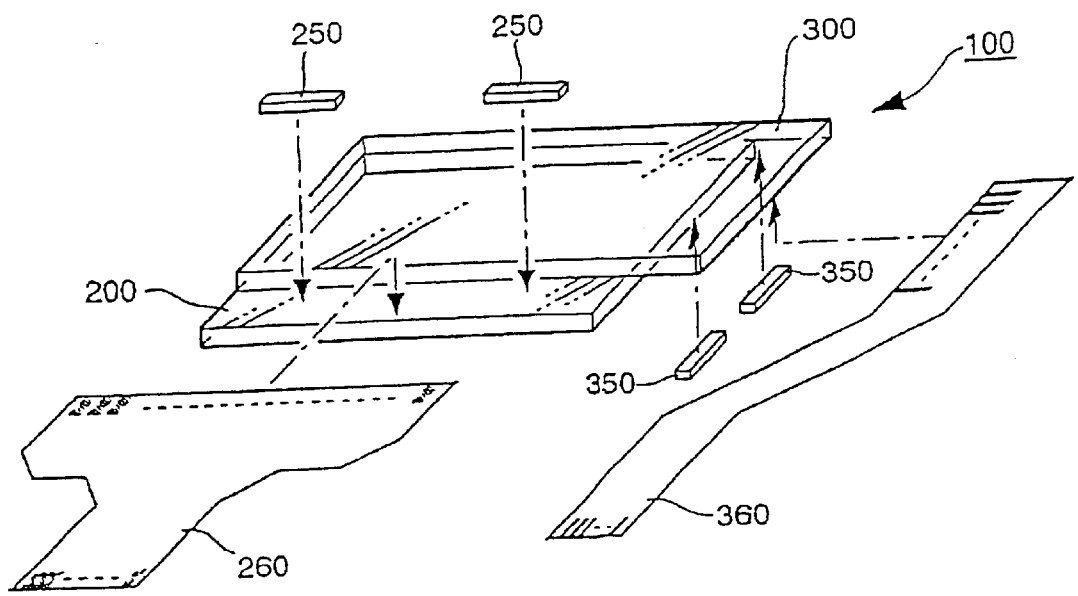

PROBE FOR INSPECTING LIQUID CRYSTAL DISPLAY PANEL, AND APPARATUS AND METHOD FOR INSPECTING LIQUID CRYSTAL DISPLAY PANEL

BACKGROUND OF THE INVENTION

1. Technical Field

The present invention relates to a probe for inspecting a liquid crystal display panel suitably used in a display inspection before mounting a bare chip (integrated circuit), and the like, for supplying a driving signal, and an apparatus and a method for inspecting a liquid crystal display panel using the probe.

2. Discussion

In general, liquid crystal display panels are subjected to inspection for short circuits, breakage, and display properties, and the like, and bare chips, and the like, which are electronic parts for supplying a driving signal, are then actually mounted on the liquid crystal display panels that have passed the inspections. In the inspections of the liquid crystal panels, a method has been adopted in which pin probes are positioned and brought into contact with terminals formed on the panels and on which the bare chips are to be mounted, the actual driving signal is supplied via the pin probes, and the display thereof is checked.

However, since the pin probe includes therein a fine spring, and the like, it has a drawback of being very mechanically breakable. In addition, since the terminal spaces of the bare chips are usually narrow, the pin probes are arranged very close together. Therefore, there is a problem in that it is difficult to manufacture an inspecting apparatus, and the manufacturing cost of the inspecting apparatus is very high.

The present invention is made in view of the above-mentioned problem, and has as objects thereof to provide a probe for inspecting a liquid crystal display panel which is unbreakable in the inspection of liquid crystal display panels and which can be manufactured at low cost, and to provide an apparatus and a method for inspecting liquid crystal display panels using the probe.

SUMMARY OF THE INVENTION

In order to achieve the above-mentioned object, according to a first aspect of the invention, there is provided a probe for inspecting a liquid crystal display panel in which liquid crystal is sealed between a pair of panel substrates, a display state is controlled by a plurality of scanning lines and a plurality of data lines, and scanning line terminals for the plurality of scanning lines and data line terminals for the plurality of data lines are formed on the panel substrates, respectively, the probe comprising a flexible substrate on which is formed a conductive pattern including connecting terminals connected to at least one of the scanning line terminals and the data line terminals, and on which is mounted an electronic part for supplying a signal for driving at least one of the scanning lines and the data lines to the connecting terminals via the conductive pattern.

According to such a configuration, the driving signal is supplied to the scanning line terminals or the data line terminals formed on the panel substrate via the connecting terminals, which are portions of the conductive pattern formed on the flexible substrate. Therefore, the liquid crystal display panel can be inspected for the display without the aid of a pin probe.

In addition, according to a second aspect of the invention, there is provided an apparatus for inspecting a liquid crystal display panel in which liquid crystal is sealed between a pair of panel substrates, a display state is controlled by a plurality of scanning lines and a plurality of data lines, and scanning line terminals for the plurality of scanning lines and data line terminals for the plurality of data lines are formed on the panel substrates, respectively, the apparatus comprising: a first connector for securing connecting terminals formed on a first flexible substrate to the scanning line terminals formed on one of the panel substrates; a second connector for securing connecting terminals formed on a second flexible substrate to the data line terminals formed on the other one of the panel substrate; a first supply means mounted on the first flexible substrate and supplying a signal for driving the scanning lines to the connecting terminals formed on the first flexible substrate via a conductive pattern; and a second supply means mounted on the second flexible substrate and supplying a signal for driving the data lines to the connecting terminals formed on the second flexible substrate via a second conductive pattern formed on the second flexible substrate and including the connecting terminals.

According to the described configuration, the inspection of the liquid crystal display panel using the inspecting probe according to the first aspect of the invention becomes possible.

Further, according to a third aspect of the invention, there is provided a method for inspecting a liquid crystal display panel in which liquid crystal is sealed between a pair of panel substrates, a display state is controlled by a plurality of scanning lines and a plurality of data lines, and scanning line terminals for the plurality of scanning lines and data line terminals for the plurality of data lines are formed on the panel substrates, respectively, the method comprising the steps of: securing connecting terminals formed on a first flexible substrate to the scanning line terminals formed on one of the panel substrates, while securing connecting terminals formed on a second flexible substrate to the data line terminals formed on the other one of the panel substrates; and supplying a signal for driving the scanning lines to the connecting terminals on the first flexible substrate by an electronic circuit mounted on the first flexible substrate via a conductive pattern formed on the first flexible substrate, while supplying a signal for driving the data lines to the connecting terminals on the second flexible substrate by an electronic circuit mounted on the second flexible substrate via a conductive pattern formed on the second flexible substrate.

According to the described method, the inspection of the liquid crystal display panel using the inspecting probe according to the first aspect of the invention becomes possible.

BRIEF DESCRIPTION OF THE DRAWINGS

FIG. 1(a) is a perspective view showing the positional relation of respective components of a liquid crystal display panel according to an embodiment of the present invention.

FIG. 1(b) is a perspective view showing a configuration thereof during inspection.

FIG. 2 is a drawing showing a configuration of terminal portions of the liquid crystal display panel to be inspected in an inspecting apparatus.

FIG. 3 is a perspective view showing a configuration of a probe unit in the inspecting apparatus.

FIG. 4 is a drawing for the explanation of a state of mounting performed on the liquid crystal display panel that has passed the inspection of the inspecting apparatus.

DETAILED DESCRIPTION OF THE PREFERRED EMBODIMENT

An embodiment of the present invention will now be described with reference to the drawings.

First, a description will be given of a configuration of a liquid crystal display panel to be inspected in an inspecting apparatus according to this embodiment. As shown in FIG. 1(a), a liquid crystal display panel 100 to be inspected includes two substrates made of glass or the like adhered so as to oppose each other, and liquid crystal is sealed in the space therebetween. Here, a plurality of scanning lines are formed on an adhering face of one substrate 200 so as to be vertically parallel with each other, while a plurality of data lines are formed on an adhering face of the other substrate 300 so as to be horizontally parallel with each other. The substrates 200 and 300 are provided with scanning line terminals and data line terminals, respectively, in order to draw the scanning lines and the data lines to the outside.

Incidentally, the liquid crystal display panel 100 having the structure as described above corresponds to a liquid crystal display panel of an active matrix system for driving pixel electrodes using a two-terminal nonlinear element such as a TFD (Thin Film Diode), and to a liquid crystal display panel of a passive matrix system which does not use the nonlinear element. The present invention, however, is not limited thereto, and can be applied to a liquid crystal display panel having terminals for drawing the scanning lines and data lines to the outside provided on one substrate, for example, a liquid crystal display panel of an active matrix system using a three-terminal nonlinear element such as a TFT (Thin Film Transistor) as an element for switching the pixel electrodes.

Next, terminal portions of the substrates 200 and 300 will be described. FIG. 2 is an enlarged plan view of a principal part in the terminal portion of the substrate 300. Incidentally, this drawing corresponds to FIG. 1 as viewed from the back (bottom surface) thereof.

Referring to the drawing, data line terminals 312*a* are end portions of a plurality of data lines 312 formed on the substrate 300, and are closely spaced in a comb-like manner in the vicinity of an end of the element substrate 200. On the other hand, control terminals 370*a* extended from external terminals 370 are formed so as to oppose the data line terminals 312*a*. Incidentally, scanning lines 212 are formed on the substrate 200 and extend in a direction perpendicular to the data lines 312.

Here, on the liquid crystal display panel 100 that is determined to be normal by the inspecting apparatus according to this embodiment, bare chips for driving the respective data lines are mounted in an area indicated by a broken line 351 by a technique such as a COG (Chip On Glass), and an FPC (Flexible Printed Circuit) for supplying a control signal from the outside to the bare chips is connected to the external terminal 370, as indicated by a broken line 361. That is, as shown in FIG. 4, bare chips 250 are mounted on the terminal portion of the substrate 200, and an FPC 260 is connected thereto, while bare chips 350 are mounted on the terminal portion of the substrate 300, and an FPC 360 is connected thereto. In this embodiment, however, since the liquid crystal display panel 100 before inspection is the subject to be described, neither the bare chips nor the FPCs are mounted and connected at this point of time.

Incidentally, in this embodiment, two bare chips 350 shall be mounted on the terminal portion of the opposite substrate 300. In addition, a similar construction applies to the terminal portion of the element substrate 200 except that the data lines 312 are replaced by the scanning lines 212.

An inspecting apparatus according to this embodiment will now be described. FIG. 1(a) shows a positional relation of components of the inspecting apparatus before the inspection. As shown in the drawing, in inspecting the liquid crystal display panel 100, each one side of probe units 280 is pressed by an elastic member, such as rubber or urethane at the terminal portion of the substrate 200. On the other hand, each side of probe units 380 is pressed by a similar elastic member at the terminal portion of the substrate 300. Incidentally, in this case, the liquid crystal display panel 100 may be preferably accommodated and positioned in a jig or the like.

The probe units 280 and 380 will now be described. FIG. 3 is a perspective view showing a configuration of the probe unit 380. In the drawing, the probe unit 380 includes a substrate 381 having flexibility, such as PI (polyimide) or PET (polyethylene terephthalate), on which a conductive pattern, such as copper foil, is subjected to patterning, and the bare chip 350 for driving respective data lines 312 mounted thereon by an anisotropic adhesive 382. Connecting terminals 384 and external terminals 386 are formed on the opposite two sides of the probe unit 380, respectively. The former connecting terminals 384 contact the data line terminals 312*a* formed on the substrate 300 of the liquid crystal display panel 100 to be inspected, and are formed in the same number and at the same pitch as those of the data line terminals 312*a*. On the other hand, the latter external terminals 386 are connected to a circuit board (omitted from the drawing) for supplying a control signal to the bare chip 350.

Here, the bare chip 350 is the same as that mounted in the area 351 of the opposite substrate 300 after the inspection; however, it is in a reversed state on the probe unit 380, as compared with a case where it is mounted on the opposite substrate 300 after inspection. Accordingly, the conductive pattern from the connecting terminals 384 to the bare chip 350 on the probe unit 380 achieves a positional relation shown in FIG. 3 when mounting positions a, b, c, and d of the area 351 in FIG. 2 are used. Incidentally, such a conductive pattern can be achieved by making the substrate 381 to a multilayer substrate and by forming a through hole therein, or by narrowing the pitches of the conductive pattern. In addition, if inner lead bonding is employed like a TCP (Tape Carrier Package), the bare chip 350 can be mounted without being reversed.

On the other hand, an area, except for the mounting portion of the external terminals 386 and the bare chip 350, particularly, an area in the vicinity of the connecting terminals 384 but other than the connecting terminals 384, is covered with an insulating film 388. Here, the length of the connecting terminals 384 exposed from the insulating film 388 is substantially the same as the length of the data line terminals 312*a* of the opposite substrate 300 from an end face of the element substrate 200.

When such probe units 280 and 380 are pressed by the elastic members 290 and 390, they are placed in the state shown in FIG. 1(a). More specifically, one side of the probe unit 380 on which the connecting terminals 384 are formed is pressed to the substrate 300 along an end of the substrate 200, and with the connecting terminals 384 and the data line terminals 312*a* registered. Consequently, the connecting terminals 384 of the probe unit 380 are pressed so as to be in contact with the data line terminals 312*a* of the substrate 300, thereby achieving electrical connection. Similarly, one side of the probe unit 280 on which the connecting terminals are formed is pressed to the substrate 200 along an end face of the substrate 300, and with the connecting terminals of the probe unit and scanning line terminals registered, thereby achieving electrical connection therebetween.

A control signal for the bare chips 350 is supplied to the external terminals 386 of the probe unit 380, while a control signal for the bare chips 250 is supplied to the external terminals of the probe unit 280.

This brings about a state in which a driving signal, which is the same as that supplied when the bare chips 250 and 350 are COG-mounted on the terminal portions of the substrates 200 and 300, is supplied to the plurality of scanning lines 212 of the substrate 200 and the plurality of data lines 312 of the substrate 300. Accordingly, if the liquid crystal display in this state is determined by image analysis with a CCD or the like, and visual inspectionor the like, display inspection of pixel failures or the like can be conducted.

According to the inspection of the liquid crystal display panel of this embodiment, before mounting the bare chips 250 and 350 on the substrates 200 and 300, the connecting terminals 384 comprising of copper-foil are subjected to patterning on the substrate 300 having flexibility, and the driving signal is supplied to the respective plurality of data lines 312 by the probe unit 380 having mounted thereon the bare chips 350, while the driving signal is supplied to the respective plurality of scanning lines 212 by the similar probe unit 280. Therefore, since the need for using expensive and breakable pin probes or the like is eliminated, it becomes possible to make the inspecting apparatus regarding the display of the liquid crystal display panel 100 inexpensive and unbreakable.

At this time, the probe unit 380 comes into contact with the substrate 300 only at a portion of the data line terminals 312a, and other portions are covered with the insulating film 388. Therefore, shorting of a circuit caused by the contact of the external terminals 370 and the control terminals 370a, which are not dependent on contact with the probe unit 380 on the substrate 300, with the conductive pattern of the prove unit 380 is prevented. This aspect also applies to the probe unit 280.

In addition, since the substrate 381 of the probe unit 380 has flexibility, merely by bringing the connecting terminals 384 of the probe unit 380 into contact with the data line terminals 312a of the substrate 300, electrical connection may not be assured. However, the connecting terminals 384 are uniformly stressed by pressing the substrate 381 via the elastic member 390, so that reliability of electrical connection is increased. This aspect also applies to the probe unit 280.

As described above, according to the present invention, since the driving signal is supplied to the scanning line terminals or the data line terminals formed on the panel substrate via the connecting terminals, which are portions of the conductive pattern formed on the flexible substrate, the inspection on the display of the liquid crystal display panel can be conducted without the aid of the pin probe, or the like. Therefore, it becomes possible to construct a probe for inspecting the liquid crystal display panel so as to be unbreakable, and to substantially reduce the manufacturing cost thereof.

What is claimed is:

1. A probe unit for inspecting a liquid crystal display panel in which liquid crystal is sealed between a pair of panel substrates, a display state is controlled by a plurality of scanning line terminals for said plurality of scanning lines and data line terminals for said plurality of data lines are formed on said panel substrates, respectively, said probe unit comprising:

a substrate on which a conductive pattern including connecting terminals capable of being connected to at least one of said scanning line terminals and said data line terminals; and an electronic part mounted on said substrate for supplying a signal for driving at least one of said scanning lines and said data lines to said connecting terminals via said conductive pattern.

2. The probe unit for inspecting a liquid crystal display panel according to claim 1, wherein an area on said substrate, except for said connecting terminals, is covered with an insulating film at least in the vicinity of said connecting terminals.

3. An apparatus for inspecting a liquid crystal display panel in which liquid crystal is sealed between a pair of panel substrates, a display state is controlled by a plurality of scanning lines and a plurality of data lines, and scanning line terminals for said plurality of scanning lines and data line terminals for said plurality of data lines are formed on said panel substrates, respectively, said apparatus comprising:

a first connector securing connecting terminals formed on a first substrate to said scanning line terminals formed on one of said panel substrates;

a second connector securing connecting terminals formed on a second substrate to said data line terminals formed on the other one of said panel substrates;

a first driver mounted on said first substrate and supplying a signal driving said scanning lines to said connecting terminals via a conductive pattern; and a second driver mounted on said second substrate and supplying a signal driving said data lines to said connecting terminals via said conductive pattern.

4. The apparatus for inspecting a liquid crystal display panel according to claim 3, wherein at least one of said first and second connectors presses the connecting terminals formed on at least one of said first and second substrates to one of said panel substrates by an elastic member.

5. A method for inspecting a liquid crystal display panel in which liquid crystal is sealed between a pair of panel substrates, a display state is controlled by a plurality of scanning lines and a plurality of data lines, and scanning line terminals for said plurality of scanning lines and data line terminals for said plurality of data lines are formed on said panel substrates, respectively, said method comprising the steps of:

securing connecting terminals formed on a first substrate to said scanning line terminals formed on one of said panel substrates, while securing connecting terminals formed on a second substrate to said data line terminals formed on the other one of said panel substrates; and supplying a signal for driving said scanning lines to said connecting terminals by an electronic circuit mounted on said first substrate via a conductive pattern, while supplying a signal for driving said data lines to said connecting terminals by an electronic circuit mounted on said second substrate via the conductive pattern.

6. A probe unit for inspecting a display panel, the display panel including a data line and a scanning line, comprising:

a multi-layer substrate having a first layer and a second layer, said first layer including a through hole;

a connecting terminal formed on said second layer; and a driver mounted on said second layer through said through hole for supplying a signal for driving at least one of the data line and the scanning line, said driver being electrically coupled to said connecting terminal by a conductive pattern formed on said second layer.

7. The probe unit according to claim 1 wherein said first layer is an insulating layer which covers a portion of the connecting terminal.

8. A probe unit for inspecting a display panel, the display panel including a data line and a scanning line, comprising:

a substrate;

a driver mounted on said substrate for supplying a driving signal;

a connecting terminal formed on said substrate; and a conductive pattern electrically connecting the connecting terminal and the driver.

9. An apparatus for inspecting a display panel, the display panel including a data line and a scanning line, comprising:

a first multi-layer substrate having a first layer and a second layer, said first layer of said first multi-layer substrate including a first through hole;

a first connecting terminal formed on said second layer of said first multi-layer substrate and electrically coupled to one of the data line and the scanning line;

a first driver mounted on said second layer of said first multi-layer substrate through said first through hole for supplying a first signal for driving one of the data line and the scanning line, said first driver being electrically coupled to said first connecting terminal by a first conductive pattern formed on said second layer of said first multi-layer substrate; and a first elastic member supplying pressure to said first multi-layer substrate toward the display panel such that said first connecting terminal electrically contact one of the data line and the scanning line.

10. The apparatus according to claim 9, further comprising:

a second multi-layer substrate having a first layer and a second layer, said first layer of said second multi-layer substrate including a second through hole;

a second connecting terminal formed on said second layer of said second multi-layer substrate and electrically coupled to the other of the data line and the scanning line;

a second driver mounted on said second layer of said second multi-layer substrate through said second through hole for supplying a second signal for driving the other of the data line and the scanning line, said second driver being electrically coupled to said second connecting terminal by a second conductive pattern formed on said second layer of said second multi-layer substrate; and a second elastic member supplying pressure to said second multi-layer substrate toward the display panel such that said second connecting terminal electrically contacts the other of the data line and the scanning line.

11. An apparatus for inspecting a display panel, the display panel including a series of data lines and scanning lines that are divided into a first group and a second group, comprising:

a first substrate including a first driver mounted thereon and first conductive terminals connected to the first driver;

a second substrate including a second driver mounted thereon and second conductive terminals connected to the second driver; and an elastic member, wherein each of the first conductive terminals and the second conductive terminals corresponds to the first group of data lines and scanning lines, and wherein the elastic member supplies pressure to the first and second conductive substrates towards the display panel such that each of the first and second conductive terminals simultaneously contact the respective group of lines.

12. An apparatus for inspecting a display panel, the display panel including a data line and a scanning line, comprising:

a substrate having a first side and a second side;

a connecting terminal formed on said first side of said substrate and electrically connected to one of the data line and the scanning line;

a driver mounted on said second side of said substrate for supplying a signal for driving at least one of the data line and the scanning line, said driver being electrically coupled to said connecting terminal by a conductive pattern formed on said substrate; and an elastic member supplying pressure to said substrate toward the display panel such that said connecting terminal electrically contact one of the data line and the scanning line.

13. A method for inspecting a display panel, the display panel including a data line and a scanning line, the method comprising the steps of:

contacting a first connecting terminal formed on a layer of a first multi-layer substrate to one of the data line and the scanning line; and supplying a first signal from a first driver mounted on said layer of said first multi-layer substrate to one of the data line and the scanning line.

14. The method according to claim 13 further comprising the steps of:

contacting a second connecting terminal formed on a layer of a second multi-layer substrate to the other of the data line and the scanning line; and supplying a second signal from a second driver mounted on said layer of said second multi-layer substrate to the other of the data line and the scanning line.

15. A method for inspecting a display panel, the display panel including a series of data lines and a series of signal lines that is divided into a first group and a second group, the method comprising:

contacting a first conductive terminal, formed on a first substrate, with the first group of data lines and signal lines, the first conductive terminal being connected to a first driver mounted on the first substrate;

contacting a second conductive terminal, formed on a second substrate, with the second group of data lines and signal lines, the second conductive terminal being connected to a second driver mounted on the second substrate;

supplying a signal from the first driver to the first group of data lines and signal lines; and supplying a signal from the second driver to the second group of data lines and signal lines, wherein an elastic member supplies pressure to the first and second substrate towards the display panel such that each of the first and second conductive terminals simultaneously contact respective group of lines.

16. A probe unit for inspecting a liquid crystal display panel in which liquid crystal is sealed between a pair of panel substrates, a display state is controlled by a plurality of scanning lines and a plurality of data lines, and scanning line terminals for said scanning lines and data line terminals for said plurality of data lines are formed on said panel substrates, respectively, said probe unit comprising:

a substrate in which is formed a conductive pattern including connecting terminals connected to at least one of the scanning line terminals and data line terminals; and an electronic part mounted on said substrate to supply a signal for driving at least one of the scanning lines and data lines to said connecting terminals via said conductive pattern during an inspection mode, wherein the signal supplied by said electronic part is substantially the same as a signal supplied during operation of the liquid crystal display panel.

* * * * *

UNITED STATES PATENT AND TRADEMARK OFFICE
CERTIFICATE OF CORRECTION

PATENT NO. : 6,300,998 B1
DATED : October 9, 2001
INVENTOR(S) : Yasuhito Aruga

Page 1 of 1

It is certified that error appears in the above-identified patent and that said Letters Patent is hereby corrected as shown below:

Title page,
ABSTRACT, line 10, after "300" insert -- of --.

Column 5,
Line 14, "inspectionor" should be -- inspection or --.
Line 19, delete "comprising" and insert -- comprised -- therefor.
Line 38, delete "prove" and insert -- probe -- therefor.

Signed and Sealed this

Second Day of April, 2002

*Attest:*

*Attesting Officer*

JAMES E. ROGAN
*Director of the United States Patent and Trademark Office*